United States Patent [19]

Schweitzer, Jr.

[11] 4,165,528

[45] Aug. 21, 1979

[54] FAULT INDICATOR AND MEANS FOR RESETTING SAME

[76] Inventor: Edmund O. Schweitzer, Jr., 1002 Dundee Rd., Northbrook, Ill. 60062

[21] Appl. No.: 877,470

[22] Filed: Feb. 13, 1978

Related U.S. Application Data

[62] Division of Ser. No. 708,549, Jul. 26, 1976, Pat. No. 4,086,529.

[51] Int. Cl.² ............................................. G01R 31/02
[52] U.S. Cl. ................................... 361/156; 324/127; 361/143
[58] Field of Search ............... 361/156, 143; 324/127, 324/133; 340/664

[56] References Cited

U.S. PATENT DOCUMENTS

| | | | |
|---|---|---|---|
| 3,375,510 | 3/1968 | Pitches | 324/133 |
| 3,426,275 | 2/1969 | Schweitzer, Jr. | 324/127 |
| 3,991,366 | 11/1976 | Schweitzer, Jr. | 340/664 X |
| 4,045,726 | 8/1977 | Schweitzer, Jr. | 340/664 X |

Primary Examiner—J. D. Miller
Assistant Examiner—L. C. Schroeder
Attorney, Agent, or Firm—Lockwood, Dewey, Alex & Cummings

[57] ABSTRACT

A fault indicator for alternating current distribution systems includes a pair of spaced pole pieces for receiving therebetween at one end the conductor and at the other end a pivoted permanent magnet carrying a target that is biased to a fault indicating position by a stationary permanent magnet. The pole pieces are demagnetized on flow of fault current in the conductor. They are remagnetized by a winding which is energized by discharge of a capacitor that is charged through a rectifier from an oscillator circuit. The winding is carried by a receptacle into which the other ends of the pole pieces are inserted and a circuit is completed thereby to charge the capacitor. The receptacle is carried at one end of a tubular housing the other end of which has an eye to receive a claw of a live line tool for applying the fault indicator to and removing it from the conductor.

5 Claims, 6 Drawing Figures

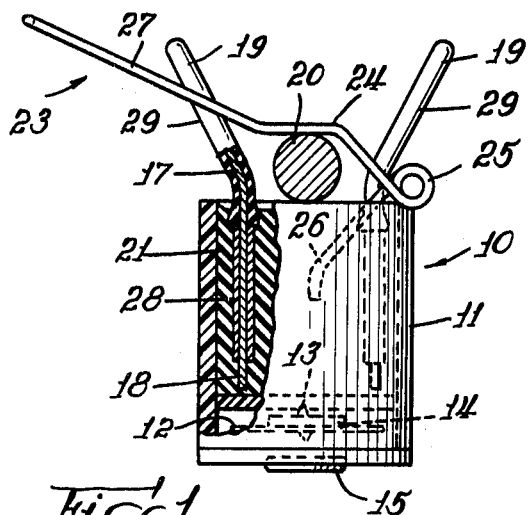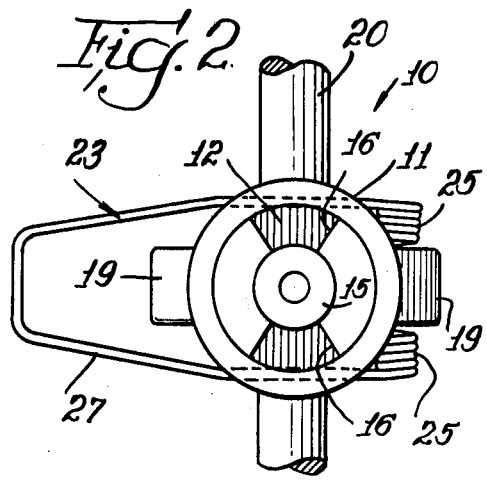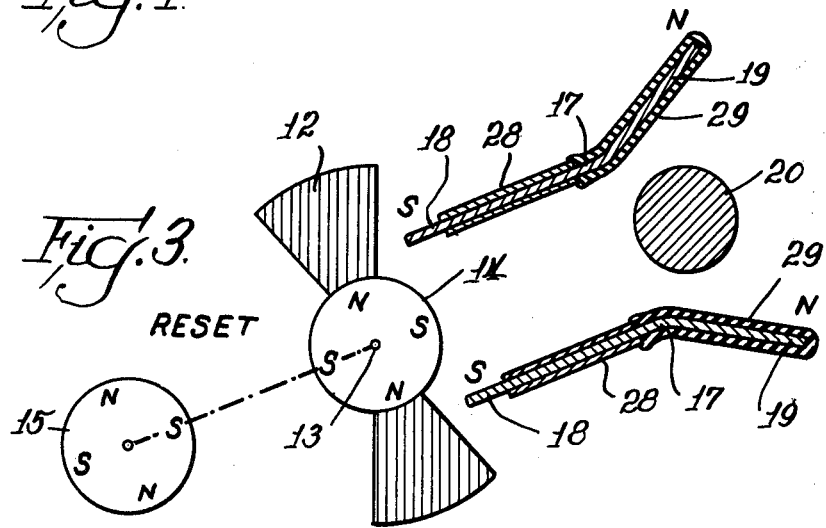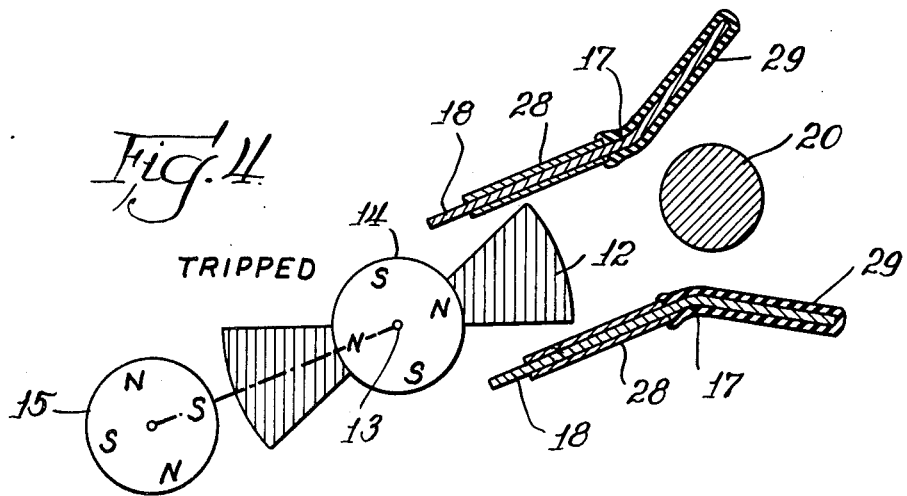

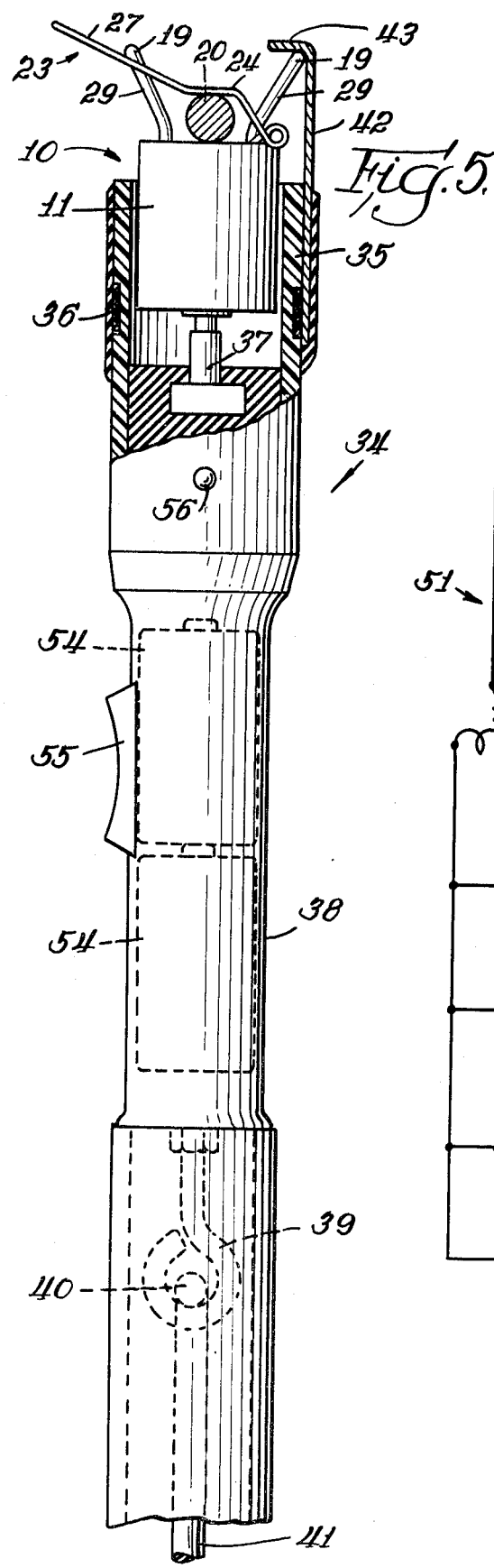
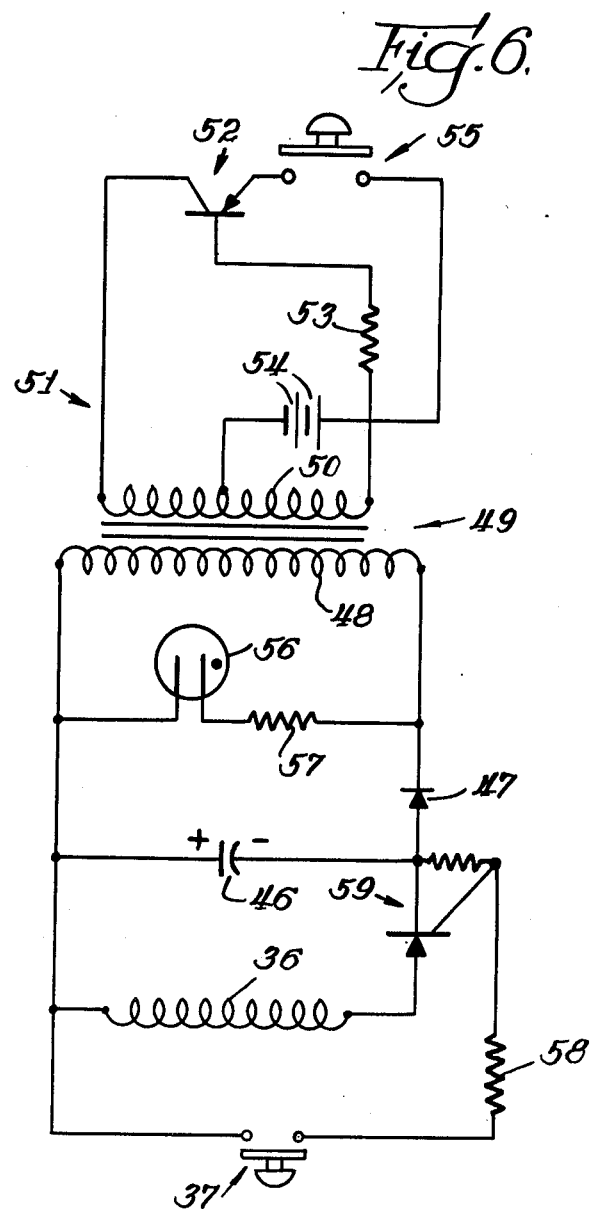

FAULT INDICATOR AND MEANS FOR RESETTING SAME

This is a division of application Ser. No. 708,549, filed July 26, 1976, now U.S. Pat. No. 4,086,529, issued April 25, 1978.

This invention relates, generally, to alternating current fault indicators and it has particular relation to non-self resetting fault indicators and to manually operable means for resetting the same. It constitutes an improvement over the fault indicators disclosed in my U.S. Pat. Nos. 3,426,275 and 3,426,276 both issued Feb. 4, 1969, 3,816,816, issued June 11, 1974, and 3,906,477, issued Sept. 16, 1975.

Among the objects of this invention are to provide for demagnetizing a pair of pole pieces by the alternating magnetic field generated by flow of alternating fault current in a conductor in a new and improved manner; to provide for remagnetizing the pole pieces while they are located in operative position on a high voltage conductor; to arrange a pair of plate-like pole pieces with one end of each on opposite sides of a pivoted target magnet and the other ends flared to receive the conductor therebetween; to arrange for the fault indicator while mounted on a high voltage conductor, to be received in a receptacle having means for remagnetizing the pole pieces on insertion of the fault indicator; and to arrange for manipulation of the receptacle by a live line tool.

In the drawings:

FIG. 1 is a view, partly in side elevation and partly in section, of a fault indicator in which this invention is embodied;

FIG. 2 is a bottom plan view of the fault indicator shown in FIG. 1;

FIG. 3 is a perspective view of the target and pole pieces of the fault indicator in the reset position;

FIG. 4 is a view, similar to FIG. 3, showing the position of the target in the tripped position;

FIG. 5 is a view, partly in side elevation and partly in section of a target resetting tool in which this invention is embodied;

FIG. 6 shows diagrammatically the circuit connections that are employed in the target resetting tool shown in FIG. 5.

Referring now particularly to FIGS. 1 and 2 of the drawings, reference character 10 designates, generally, a fault indicator embodying this invention. The fault indicator 10 comprises an insulating cylindrical housing 11 within the lower end of which there is a red target 12 that is carried by a pivot 13. Secured to and pivotal with the target 12 is a target permanent magnet 14 that is polarized, as indicated in FIG. 3, with the same polarities along diameters at right angles to each other. The target 12 and its permanent magnet 14 are biased to the position shown in FIG. 4 by a stationary permanent magnet 15 which is located at the lower end of the cylindrical housing 11. As shown in FIG. 2 the red areas of the target 12 are visible through windows 16 at the lower end of the housing 11.

With a view to biasing the target 12 and its permanent magnet 13 to the reset position shown in FIG. 3 pole pieces 17 are employed. They are formed of relatively low coercive force magnetic material. Their inner ends 18, as shown in FIG. 3, normally are biased to the polarities indicated while the outer ends 19 which are flared are polarized as indicated. The flared outer ends 19 are located on opposite sides of a conductor 20 which may form a part of a high voltage electrical distribution circuit operating, for example, at 34,000 volts and 60 Hz. The inner ends 18 of the pole pieces 17 extend along the inner wall of the cylindrical housing 11, as shown in FIG. 1, and they are held securely in this position by a suitable potting compound 21.

The fault indicator 10 is held securely in position on the conductor 20 by a generally U-shaped spring clamp that is indicated, generally, at 23. It includes a hump-shaped portion 24 for overlying the conductor 20 and coil spring portions 25 for biasing the hump-shaped portion 24 into engagement with the conductor 20. The ends 26 of the U-shaped spring clamp 23 extend into the potting compound 21 and thereby are held securely in position. The loop portion 27 of the spring clamp 23 extends laterally outwardly from the fault indicator 10 for engaging the conductor 20 in applying the fault indicator 10 to the conductor 20 in a manner to be described.

When the fault indicator 10 is in operative position on the conductor 20, the inner ends 18 of the pole pieces 17 are magnetized to the polarities indicated in order to attract the opposite polarities of the target permanent magnet 14. Thereby the target 12 is biased to the reset position where the red ends are not visible through the windows 16 as shown in FIG. 2. On the occurrence of flow of fault current in the conductor 20, for example a fault current flow of 400 amperes, the alternating magnetic field generated around the conductor 20 demagnetizes the pole pieces 17 to the extent that the inner ends 18 no longer are capable of biasing the target permanent magnet 14 to the position shown in FIG. 3. As a result, the permanent magnet 15, which is polarized along diameters at right angles to each other, as shown in FIG. 4, biases the target permanent magnet 14 to the tripped position in which the red ends of the target 12 are visible through the windows 16. A lineman now viewing the fault indicator 10 with the target 12 in the position shown in FIG. 4 now is advised that fault current has flowed through the conductor 20. The target 12 remains in the tripped position, shown in FIG. 4, until the inner ends 18 of the pole pieces 17 are remagnetized to the condition illustrated in FIG. 3.

For the purpose of remagnetizing the pole pieces 17 a target resetting tool, shown generally at 34 in FIG. 5, can be employed. The tool 34 includes a cylindrical receptacle 35, preferably of insulating material, that is surrounded by a winding 36. The receptacle 35 is arranged to receive the fault indicator 10, as shown. When the fault indicator 10 is fully inserted into the receptacle 35 a switch 37 in the bottom is closed to complete a circuit, to be described, for energizing the winding 36 with direct current sufficient to magnetize the inner ends 18 of the pole pieces 17 for the purpose of resetting the target 12 to the position shown in FIG. 3.

The cylindrical receptacle 35 is mounted at one end of a tubular insulating housing 38 which may be similar to a flashlight housing. While insulation is preferred, the housing 38 can be formed of metal. The housing 38 is provided at the lower end with an eye 39 for receiving a claw 30 of a live line tool 41.

Mounted along side of the receptacle 35 is a hook 42 that may be formed of metal. The hook 42 has an end section 43 that is arranged to overlie the upper end of one of the pole pieces 17 for the purpose of applying the fault indicator 10 to the conductor 20 and for removing it therefrom.

For applying the fault indicator 10 to the conductor 20, the fault indicator 10 is inserted into the receptacle 35 and then rotated about its longitudinal axis until the end section 43 overlies the upper end of one of the pole pieces 17. Then by means of the live line tool 41 temporarily attached to the eye 39, the tool 34 is moved so that the loop portion 27 engages the conductor 20. A downward pull on the live line tool 41 then pivots the spring clamp 23 against the biasing forces of the spring portions 25 so as to clear the conductor 20. Continued movement places the hump-shaped portion 24 in the position shown in FIG. 5. Then the tool 34 is rotated about its longitudinal axis to clear the end section 43 from the outer end of the pole piece 17. Then the tool 34 can be removed leaving the fault indicator 10 in the position on the conductor 20.

For removing the fault indicator 10 from the conductor 20, the live line tool 41 manipulates the tool 34 to such position that the housing 11 is inserted in the receptacle 35. Then it is rotated about the longitudinal axis to cause the end section 43 to overlie the outer end of one of the pole pieces 17. Thereupon a downward pull on the live line tool causes the conductor 20 to push or pivot the spring clamp 23 outwardly to release the fault indicator 10 from the conductor 20.

If it is only desired to reset the fault indicator 11, the live line tool 41 manipulates the receptacle 35 to the position shown in FIG. 5 where the switch 37 is closed and the winding 36 is energized with direct current to remagnetize the inner ends 18 of the pole pieces 17. FIG. 6 shows the circuit connections that are incorporated in the resetting tool 34. The winding 36 is energized on discharge of a capacitor 46 which is charged through a rectifier 47 from a high voltage winding 48 of a transformer that is indicated, generally, at 49. The transformer 49 has a primary winding 50 which forms a part of an oscillator circuit 51. This circuit also includes a transistor 52 that is connected through a resistor 53 to one end of the primary winding 50. Batteries 54, located in the tubular housing 38, are arranged to energize the oscillator 51 on closure of pushbutton switch 55. In order to indicate visually that the oscillator circuit 51 is operating there is provided a neon lamp 56 which is connected through a resistor 57 across the high voltage winding 48. The lamp 56 is visible, as indicated in FIG. 5, through a suitable opening in the lower end of the receptacle 35. The lamp 56 also indicates that the capacitor 46 is charged.

It will be recalled that, when the fault indicator 10 is inserted in the receptacle 35, switch 37 is closed. This completes a circuit through a resistor 58 to render an SCR 59 conducting, thereby permitting the charge on capacitor 46 to flow through the winding 36 and remagnetize the inner ends 18 of the pole pieces 17. The target 12 then is reset from the tripped position, shown in FIG. 4, to the reset position shown in FIG. 3.

I claim:

1. Means for resetting the pivoted target of a fault indicator of the type having a generally cylindrical housing, a target mounted for rotation in a plane generally perpendicular to the axis of said housing at one end thereof and including a target permanent magnet mounted for rotation with said target, a stationary permanent magnet within said housing for biasing said target magnet to position said target in a fault indicating position, and means including a pair of demagnetizable pole pieces extending longitudinally in parallel-shaped relationship within said housing for biasing said target magnet to position said target in a reset position, comprising in combination:
    a receptacle dimensioned for telescopic engagement with said housing;
    a winding coaxially disposed within said receptacle for magnetic communication with said pole pieces when said housing is seated in said receptacle; and
    means for energizing said winding from a source of direct current.

2. The target resetting means according to claim 1 wherein switch means operable upon insertion of said housing in said receptacle are provided in said receptacle to energize said winding.

3. The target resetting means according to claim 1 wherein said means for energizing said winding include a capacitor arranged to be charged through a rectifier from an oscillator circuit.

4. The target resetting means according to claim 1 wherein said pole pieces extend beyond said receptacle when said housing is seated therein and wherein a hood projects from said receptacle and overlies the projecting end of one of said pole pieces to assist in applying, and removing said fault indicator from a conductor.

5. The target resetting means according to claim 2 wherein said receptacle is mounted at one end of a support for attachment to a high voltage live line tool.

* * * * *